United States Patent [19]
Fan et al.

[11] Patent Number: 5,837,578
[45] Date of Patent: Nov. 17, 1998

[54] PROCESS OF MANUFACTURING A TRENCHED STACK-CAPACITOR

[75] Inventors: Der-Tsyr Fan; Jyh-Min Tsaur; Chon-Shin Jou; Tings Wang, all of Hsinchu, Taiwan

[73] Assignee: Mosel Vitelic Inc., Hsinchu, Taiwan

[21] Appl. No.: 895,107

[22] Filed: Jul. 16, 1997

[30] Foreign Application Priority Data

Feb. 24, 1997 [TW] Taiwan ................................ 86102222

[51] Int. Cl.⁶ ............................................ H01L 21/8242
[52] U.S. Cl. .............................. 438/254; 438/3; 438/240; 438/397
[58] Field of Search ................................ 438/3, 238–240, 438/244, 253–255, 381, 387, 396–398; 257/306, 309–310

[56] References Cited

U.S. PATENT DOCUMENTS 5,563,762  10/1996  Leung et al. .............................. 438/240
5,716,875   2/1998  Jones, Jr. et al. ........................ 438/240

*Primary Examiner*—Joni Chang
*Attorney, Agent, or Firm*—Madson & Metcalf

[57] ABSTRACT

A trenched stack-capacitor applied in a memory unit is formed through a simple process of manufacturing a stack capacitor with high density. The process includes steps of: a) forming a contact window in the insulator for exposing a cell contact of the device; b) forming a first conducting layer over the insulator and on side-walls and a base of the contact window; c) forming an etching sacrificial layer over the first conducting layer and in the contact window; d) forming an etching masking layer over a portion of the etching sacrificial layer; e) forming a plural cylindrical etching sacrificial areas by removing an another portion of the etching sacrificial layer while retaining the etching sacrificial layer under the etching masking layer; f) forming a second conducting layer on the top of the etching masking layer, on side walls of the plural cylindrical etching sacrificial areas, over the first conducting layer and in the contact window; g) removing the plural cylindrical etching sacrificial areas while retaining the first conducting layer and the second conducting layer to form a first capacitor plate; h) forming a dielectric layer on the top of the first conducting layer and on the top and side walls of the second conducting layer; and i) forming a third conducting layer over the dielectric layer to serve as a second capacitor plate.

33 Claims, 11 Drawing Sheets

5,837,578

PROCESS OF MANUFACTURING A TRENCHED STACK-CAPACITOR

FIELD OF THE INVENTION

The present invention is related to a structure and a manufacturing process of a trenched stack-capacitor, and especially relates to a structure and a manufacturing process of a trenched stack-capacitor applied to the dynamic random access memory (DRAM).

BACKGROUND OF THE INVENTION

The capacity of a capacitor is related to the quality of dynamic random access memory (DRAM). The conventional simple plannar-typed capacitor is not good enough to meet the requirement of high density of DRAM. Therefore, the method of forming a hemispherical grained Si (HSG) layer for increasing the surface area of capacitor is adopted extensively in order to increase the capacity of capacitor.

Please refer to FIG. 1 showing a conventional process for manufacturing a stack capacitor. The details are described as follows:

FIG. 1(a) includes steps of: (1) forming a device 12 over silicon substrate 11; (2) forming a borophosphosilicate glass (BPSG) layer 13 over the device 12 by a chemical vapor deposition (CVD); (3) forming a contact window 15 in the borophosphosilicate glass layer 13 to expose a cell contact CC of the device 12 by a photolithography and etching techique; and (4) forming an undoped polysilicon layer 14 with a thickness of 500 Å on side walls and base of contact window 15 and over the borophosphosilicate glass layer 13 by a chemical vapor deposition.

FIG. 1(b) shows the first ion implantation process, usually using arsenic (As) ion.

FIG. 1(c) shows a step to form a chemical oxide layer 17 with a thickness ranged between 10 Å and 20 Å over the undoped polysilicon layer 14.

FIG. 1(d) shows steps to form a polysilicon layer 18 over the chemical oxide layer 17 at 560°~580° C. by a chemical vapor deposition and then to form the polysilicon layer 18 as a hemispherical grained Si (HSG) layer through an annealing process under the same operating condition, wherein the undoped polysilicon layer 14 and the polysilicon layer 18 are used to construct lower capacitor plate and the chemical oxide layer is so thin that it will not influence the conductivity between the undoped polysilicon layer 14 and the polysilicon layer 18.

FIG. 1(e) shows the second ion implantation process (usually using arsenic (As) ion) and the second annealing process.

FIG. 1(f) shows a step to remove portions of the undoped polysilicon layer 14, the chemical oxide layer 17, and the polysilicon layer 18 by a photolithography and etching techique to expose partial surface of the borophosphosilicate glass layer 13.

FIG. 1(g) shows a step to form a dielectric layer 110 of oxide-nitride-oxide (ONO) over the partial surface of the borophosphosilicate glass layer 13 and the polysilicon layer 18.

FIG. 1(h) shows a step to form a polysilicon layer 111 over the dielectric layer 110 serving as an upper capacitor plate.

To sum up, the defects of the conventional process described above are as follows:

1. The size of the stack capacitor will become smaller in the future, and hence the number of hemispherical polysilicon layer 18 on the contact window 15 is limited. If the contact window is filled with the hemispherical polysilicon layer 18, it leads to a decrease in the surface area of capacitor. The maximum capacity can be only increased up to only two times by the conventional process using hemispherical polysilicon layer for increasing the surface area of capacitor. Because the size of the capacitor will be getting smaller in the future, the method may be no longer effective then.
2. The chemical oxide layer 17 is formed before forming the hemispherical polysilicon layer 18, but the chemical oxide layer 17 under the hemispherical polysilicon layer 18 is retained in the conventional process and causes a parasitic capacity effect.
3. The angle between the hemispherical polysilicon layer 18 and the undoped polysilicon layer 14 is an acute angle (please refer to mark A in FIG. 2(a)) which reduces the breakdown voltage, limits the decrease of the thickness of the dielectric layer, and reduces package density of the device.
4. The hemispherical polysilicon layer 18 for increasing the surface area of the conventional stack capacitor is very easy to be broken (please refer to mark B in FIG. 2(b)), and hence the yield rate of the memory unit cannot be improved.

SUMMARY OF THE INVENTION

An object of the present invention is to provide a stack capacitor with the intensity of breakdown voltage increased and with the parasitic capacity effect avoided so that it can be applied to the memory unit with high density.

Another object of the present invention is to provide a structure and a manufacturing process for promoting the yield rate of a trenched stack-capacitor which can be applied in a memory unit including a silicon substrate forming thereon a device forming thereon an insulator.

According to the present invention, the manufacturing process includes steps of: a) forming a contact window in the insulator for exposing a cell contact of the device; b) forming a first conducting layer over the insulator and on side-walls and a base of the contact window; c) forming an etching sacrificial layer over the first conducting layer and in the contact window; d) forming an etching masking layer over a portion of the etching sacrificial layer; e) forming a plural cylindrical etching sacrificial areas by removing an another portion of the etching sacrificial layer while retaining the etching sacrificial layer under the etching masking layer; f) forming a second conducting layer on a top of the etching masking layer, on side walls of the plural cylindrical etching sacrificial areas, over the first conducting layer and in the contact window; g) removing the plural cylindrical etching sacrificial areas while retaining the first conducting layer and the second conducting layer to form a first capacitor plate; h) forming a dielectric layer on a top of the first conducting layer and on a top and side walls of the second conducting layer; and i) forming a third conducting layer over the dielectric layer to serve as a second capacitor plate.

Another object of the present invention is to provide a structure of a trenched stack-capacitor applied in a memory unit including a silicon substrate forming thereon a device forming thereon an insulator provided with a contact window distributed in the insulator for exposing a cell contact of the device. According to the present invention, the structure includes: (1) a first conducting layer distributed over the insulator and on side walls and defining a base of the contact window; (2) a second conducting layer, distributed on a top of the first conducting layer, having plural trenches in order to increase a surface area of the trenched stack-capacitor, wherein the first and second conducting layers are used to construct a first capacitor plate; (3) a dielectric layer distributed over the first and second conducting layers, and on side walls of the plural trenches; and (4) a third conducting layer distributed over the dielectric layer to serve as a second capacitor plate.

In accordance with an aspect of the present invention, the memory unit is a dynamic random access memory (DRAM).

In accordance with another aspect of the present invention, the device includes a transistor having a drain served as an area of the cell contact in step (a).

In accordance with another aspect of the present invention, the transistor has a gate connected to a word line.

In accordance with another aspect of the present invention, the transistor has a source connected to a bit line.

In accordance with another aspect of the present invention, the trenched stack-capacitor is formed over the insulator by way of a capacitor over bit line (C.O.B.).

In accordance with another aspect of the present invention, the trenched stack-capacitor is formed under a second insulator, formed over the second capacitor plate, by way of a capacitor under bit line (C.U.B.).

In accordance with another aspect of the present invention, the insulator is one selected from a group consisting of a silicon dioxide ($SiO_2$) layer, a silicon nitride ($Si_3N_4$) layer, a silicon-oxy-nitride (SiOxNy) layer, a phosphosilicate glass (PSG) layer and a borophosphosilicate glass (BPSG) layer.

In accordance with another aspect of the present invention, the insulator is made of one of tetra-ethyl-orthosilicate (TEOS) and silane ($SiH_4$).

In accordance with another aspect of the present invention, the insulator is formed by a chemical vapor deposition (CVD).

In accordance with another aspect of the present invention, the contact window of step (a) is formed by a photolithography and etching techique.

In accordance with another aspect of the present invention, the first conducting layer of step (b) is one layer of polysilicon and doped polysilicon.

In accordance with another aspect of the present invention, the first conducting layer of step (b) is formed by a chemical vapor deposition (CVD).

In accordance with another aspect of the present invention, the etching sacrificial layer of step (c) is a silicon dioxide ($SiO_2$) layer having a thickness ranged between 5000 Å and 10000 Å.

In accordance with another aspect of the present invention, the etching sacrificial layer of step (c) is formed by a chemical vapor deposition (CVD).

In accordance with another aspect of the present invention, the etching masking layer of step (d) is a hemispherical grained Si (HSG) layer.

In accordance with another aspect of the present invention, a step after step (d) further includes: (j) executing a photolithography and etching techique to remove portions of the etching masking layer, the etching sacrificial layer and the first conducting layer for defining a first capacitor plate.

In accordance with another aspect of the present invention, in step (e) the etching sacrificial layer is removed by a dry etching.

In accordance with another aspect of the present invention, a procedure time of the dry etching is detected by endpoint detection mode (E/P) in order to completely remove the etching sacrificial layer not masked by the etching masking layer.

In accordance with another aspect of the present invention, in step (f) a thickness of the second conducting layer is at least 700 Å which is more than that of a gap between adjacent cylindrical etching sacrificial areas formed after removing another portion of the etching sacrificial layer.

In accordance with another aspect of the present invention, a step after step (f) further includes: k) removing portions of the second conducting layer and the etching masking layer to expose tops of the plural cylindrical etching sacrificial areas;

In accordance with another aspect of the present invention, in step (k) the portions of the second conducting layer and the etching masking layer are removed by an etching back process.

In accordance with another aspect of the present invention, a procedure time of the etching back process is detected in a time mode (T/M).

In accordance with another aspect of the present invention, a procedure time of the etching back process is detected in an endpoint detection mode (E/P).

In accordance with another aspect of the present invention, step (g) includes: g1) executing a photolithography and etching techique to remove the plural cylinderical etching sacrificial areas while retaining the first conducting layer and the second conducting layer; and g2) removing portions of the first conducting layer and the second conducting layer for forming a first capacitor plate.

In accordance with another aspect of the present invention, in step (g1) the plural cylindrical etching sacrificial areas are removed by a dry etching.

In accordance with another aspect of the present invention, in step (g1) the plural cylindrical etching sacrificial areas are removed by a wet etching.

In accordance with another aspect of the present invention, the wet etching uses buffer over etching (B.O.E.) solution containing hydrofluoric acid (HF).

In accordance with another aspect of the present invention, in step (h) the dielectric layer is a layer selected from a group consisting of nitride, oxide-nitride (ON), nitride-oxide (NO), oxide-nitride-oxide (ONO), and oxide-nitride-oxide-nitride (ONON) layers.

In accordance with another aspect of the present invention, in step (h) the dielectric layer is a layer of piezo-electric material and barium-stronsium tantanite (BST).

In accordance with another aspect of the present invention, the piezo-electric layer is a layer of tantalum oxide ($Ta_2O_5$) and lead-zinc teleride (PZT).

In accordance with another aspect of the present invention, in step (h) the dielectric layer has a thickness ranged between 30 Å and 5000 Å.

In accordance with another aspect of the present invention, in step (h) the dielectric layer is formed by a chemical vapor deposition (CVD).

In accordance with another aspect of the present invention, any one of the plural trenches is a flute.

In accordance with another aspect of the present invention, the first capacitor plate is a lower capacitor plate and the second capacitor plate is an upper capacitor plate.

The present invention may best be understood through the following description with reference to the accompanying drawings, in which:

DETAILED DESCRIPTION OF THE PREFERRED EMBODIMENT

Figure 1A:
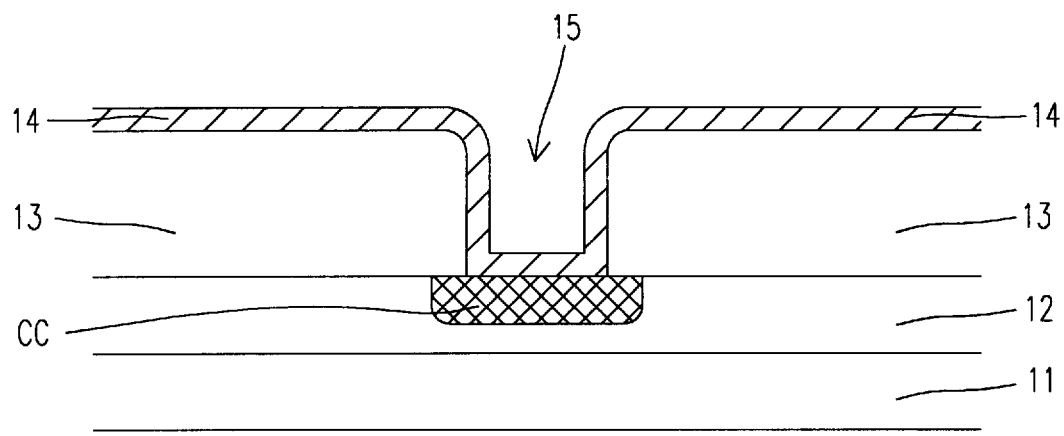
FIG. 1(a)~1(h) are schematic diagrams showing a conventional process for manufacturing the stack capacitor.
Figure 1B:
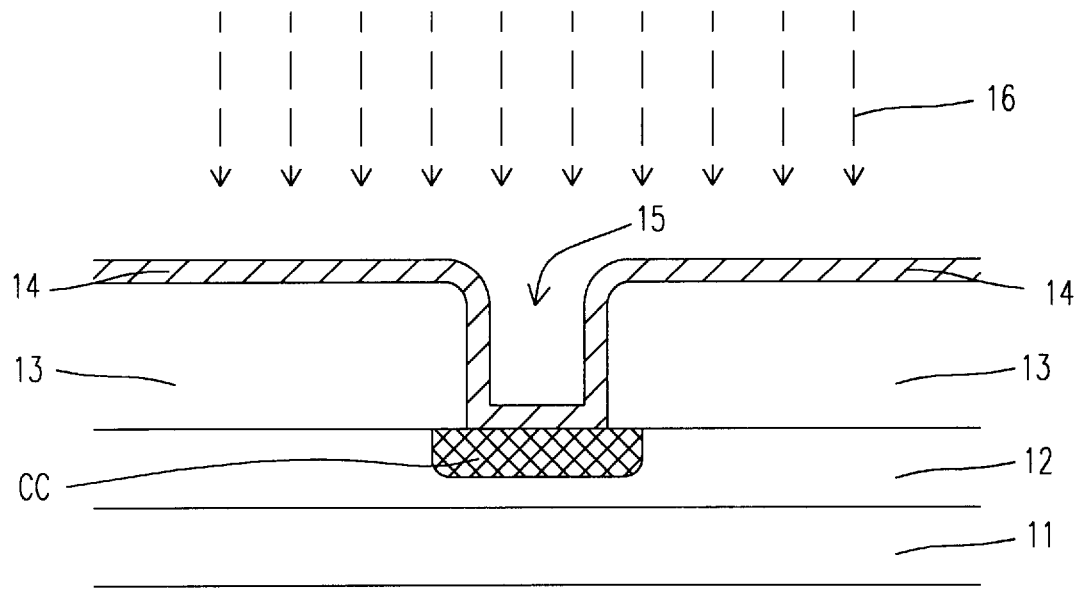
Figure 1C:
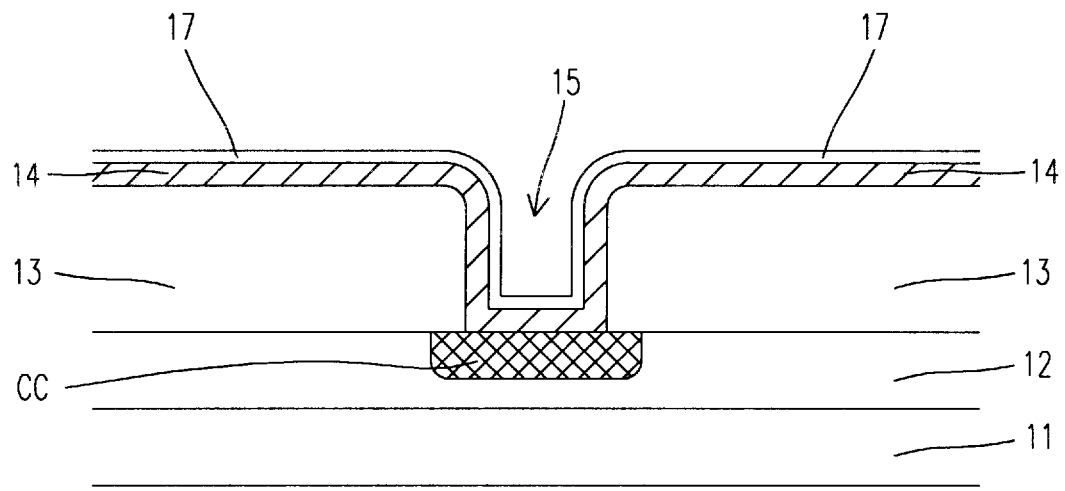
Figure 1D:
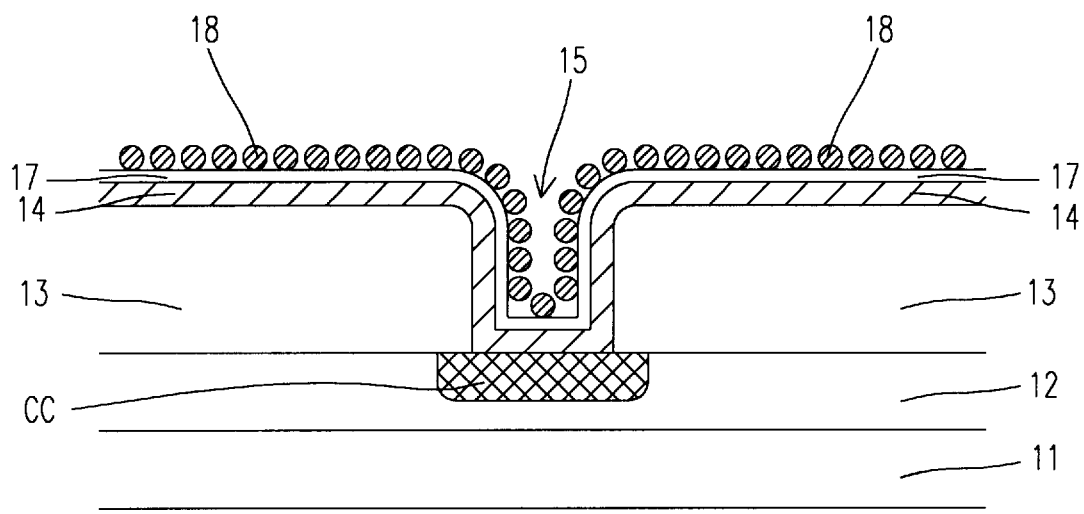
Figure 1E:
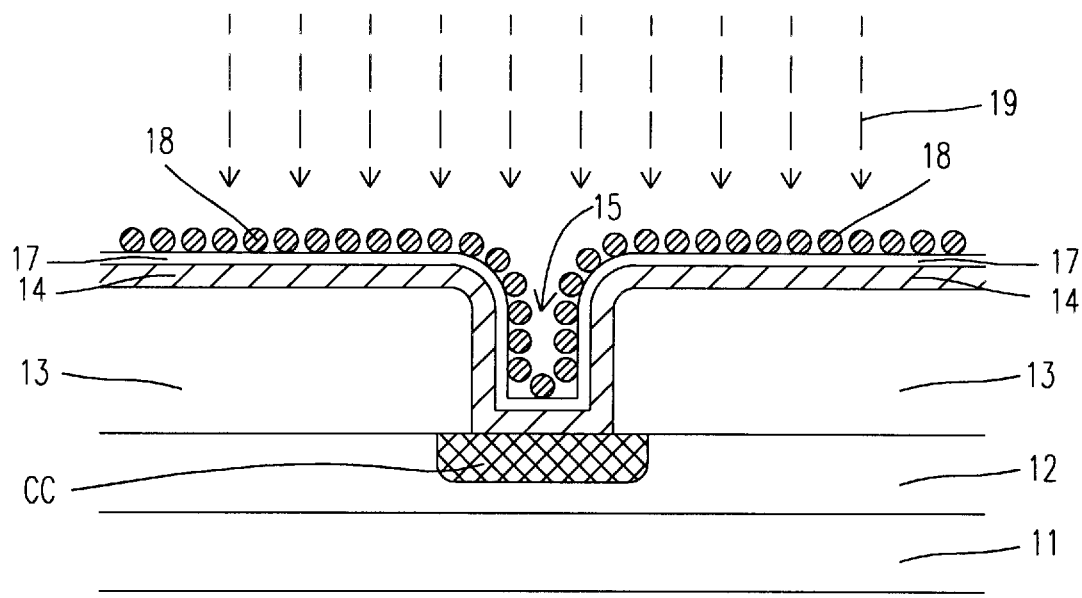
Figure 1F:
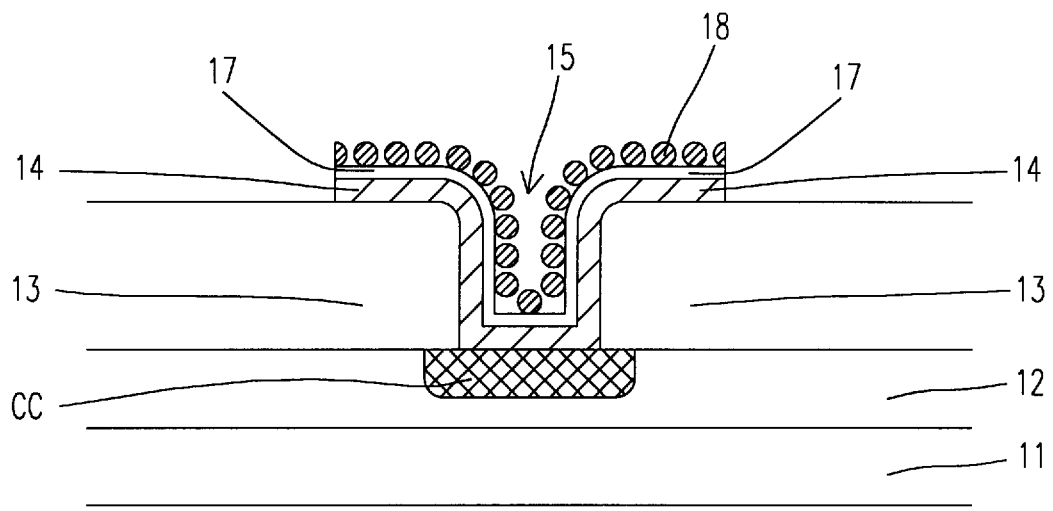
Figure 1G:
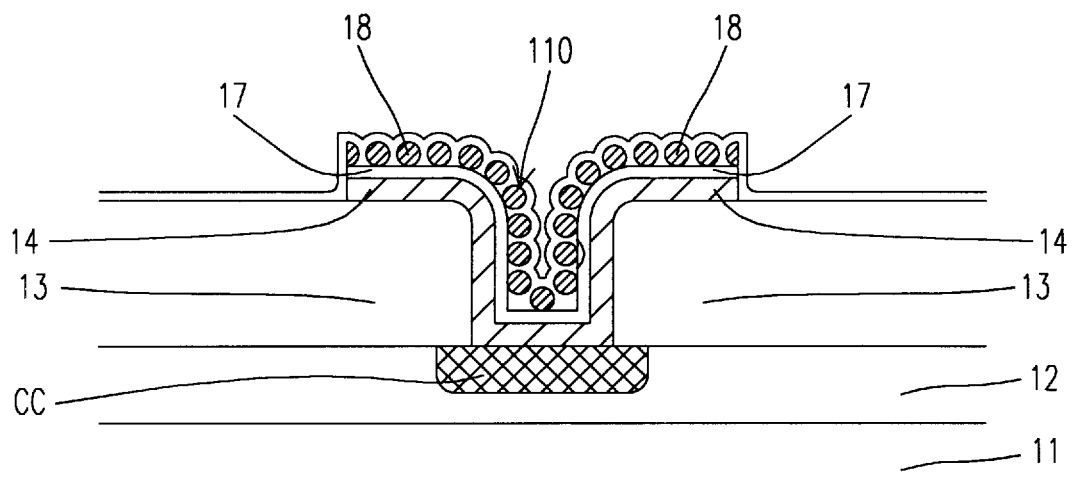
Figure 1H:
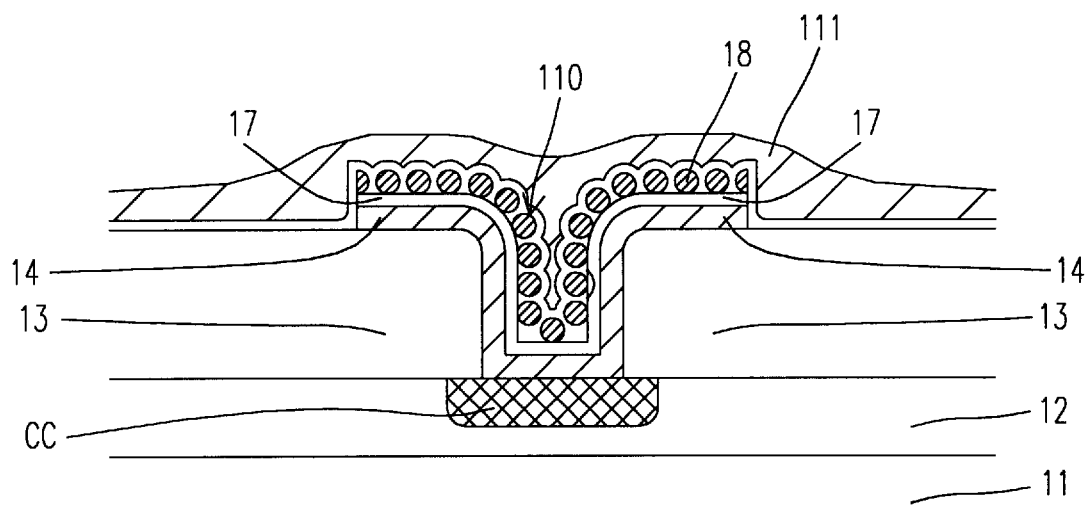
Figure 2A:
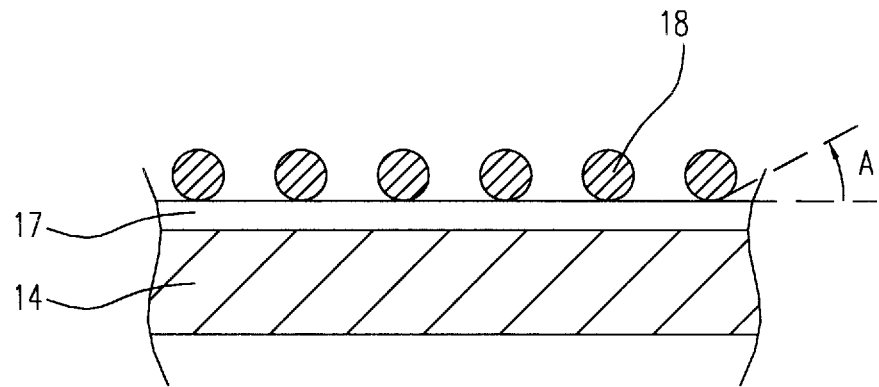
FIG. 2(a) and 2(b) are schematic diagrams showing a partial amplification of FIG. 1(d) and 1(f) respectively.
Figure 2B:
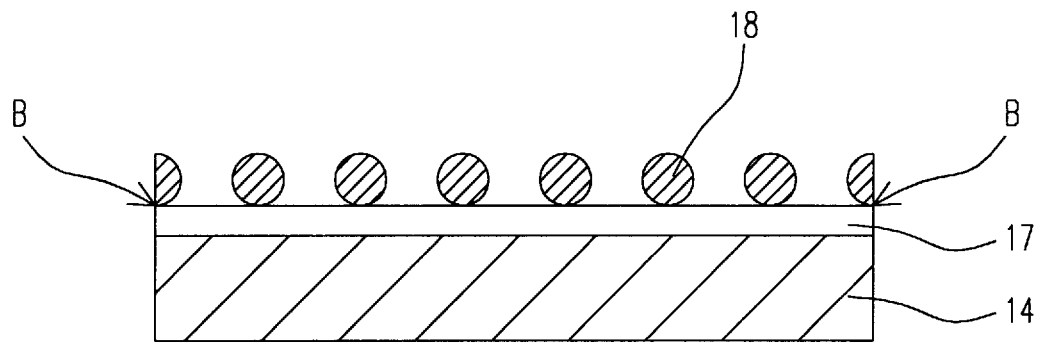
Figure 3A:
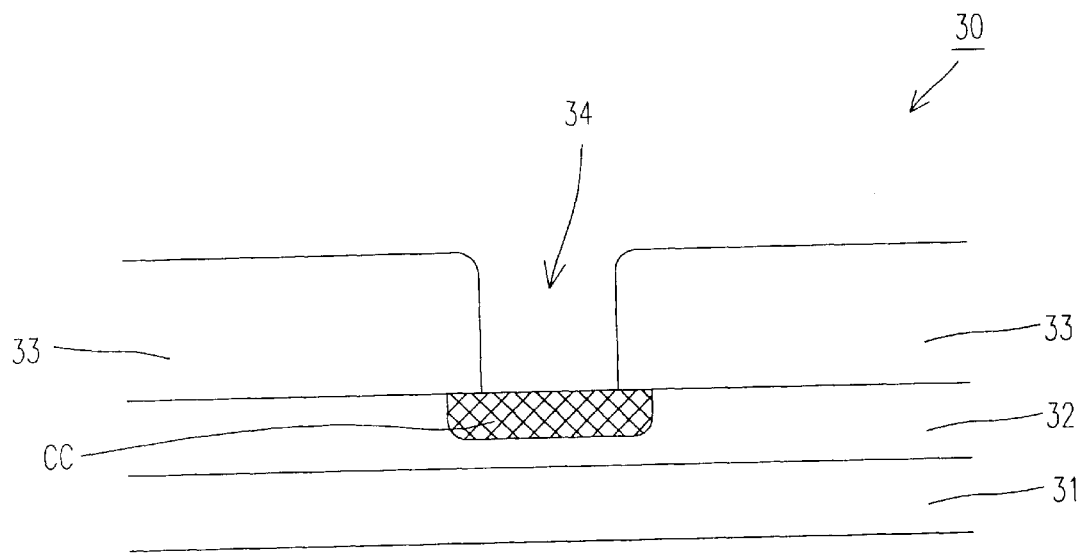
FIG. 3(a)~3(j) are schematic diagrams showing a preferred embodiment of the manufacturing process of the present invention.

Please refer to FIG. 3(a)~3(j) showing a preferred embodiment of the manufacturing process of the present invention. The details are described as follows:

FIG. 3(a) includes steps: (1) forming a device 32 over a silicon substrate 31; (2) forming an insulator 33 over the device 32, wherein the insulator 33 can be a silicon dioxide ($SiO_2$) layer, a silicon nitride ($Si_3N_4$) layer, a silicon-oxy-nitride (SiOxNy) layer, a phosphosilicate glass (PSG) layer or a borophosphosilicate glass (BPSG) layer. The insulator 33 can also be made of tetra-ethyl-ortho-silicate (TEOS) or silane ($SiH_4$); and (3) forming a contact window 34 in the insulator 33 to expose the cell contact CC of the device 32 by a photolithography and etching technique.

Certainly, the silicon substrate 31, the device 32 and the insulator 33 are included in the memory unit 30, wherein the memory unit 30 is preferably a dynamic random access memory (DRAM) and the device 32 includes a transistor (not shown) having a drain served as the cell contact CC, a gate connected to a word line (not shown), and a source connected to a bit line (not shown). Furthermore, a preferred embodiment of the stack capacitor of the present invention is that the stack capacitor is formed by way of capacitor over bit line (C.O.B.), that is, forming the insulator 33 over the bit line by a chemical vapor deposition and then forming the stack capacitor thereon. Moreover, another preferred embodiment of the stack capacitor of the present invention is that the stack capacitor is formed by way of capacitor under bit line (C.U.B.), that is, forming the stack capacitor at first, then forming a second insulator (not shown) over the stack capacitor, and finally forming a bit line over the second insulator so that the stack capacitor is under the bit line. The second insulator can be a silicon dioxide ($SiO_2$) layer, a silicon nitride ($Si_3N_4$) layer, a silicon-oxy-nitride (SiOxNy) layer, a phosphosilicate glass (PSG) layer or a borophosphosilicate glass (BPSG) layer. The second insulator can also be made of tetra-ethyl-ortho-silicate (TEOS) or silane ($SiH_4$).

Figure 3B:
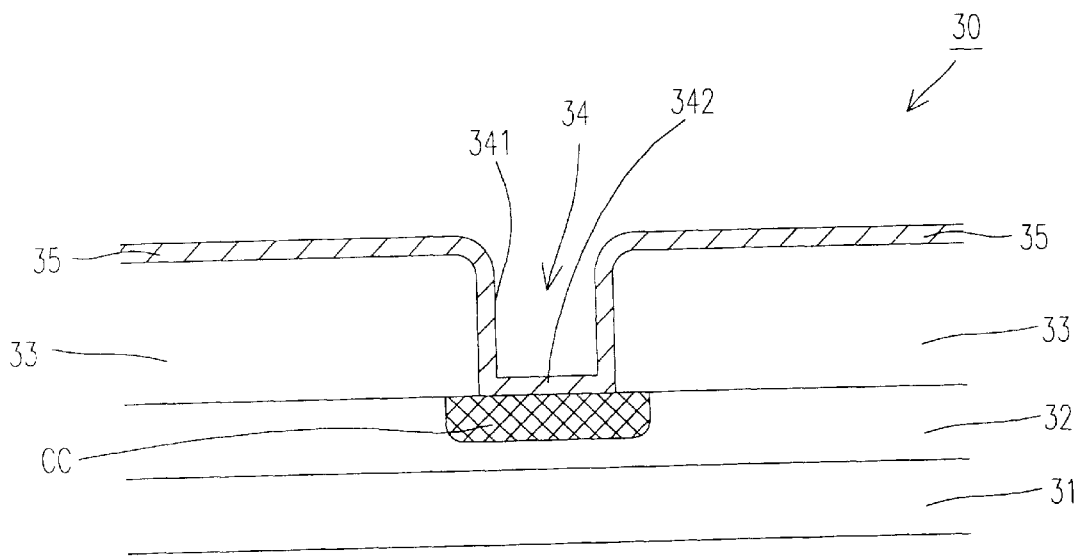

FIG. 3(b) shows a step to form a first conducting layer 35 on side walls 341 and a base 342 of the contact window 34 and over the insulator 33 by a chemical vapor deposition, wherin the first conducting layer 35 can be a doped polysilicon layer.

Figure 3C:
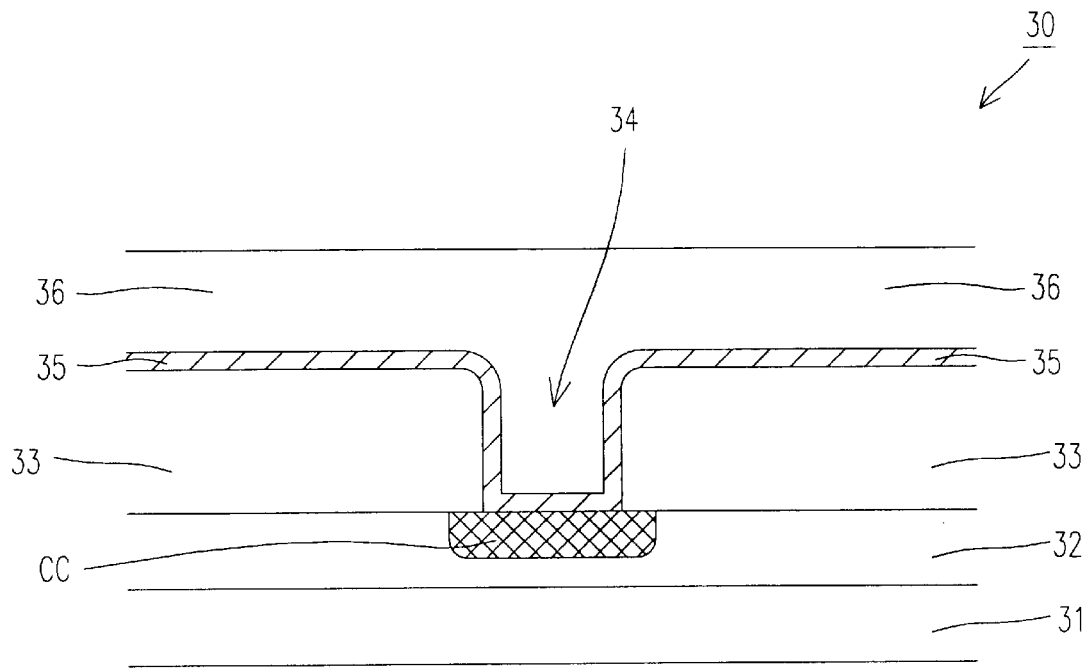

FIG. 3(c) shows a step to form an etching sacrificial layer 36 with a thickness ranged between 5000 Å and 10000 Å over the first conducting layer 35 and in the contact window 34, formed by a chemical vapor deposition.

Figure 3D:
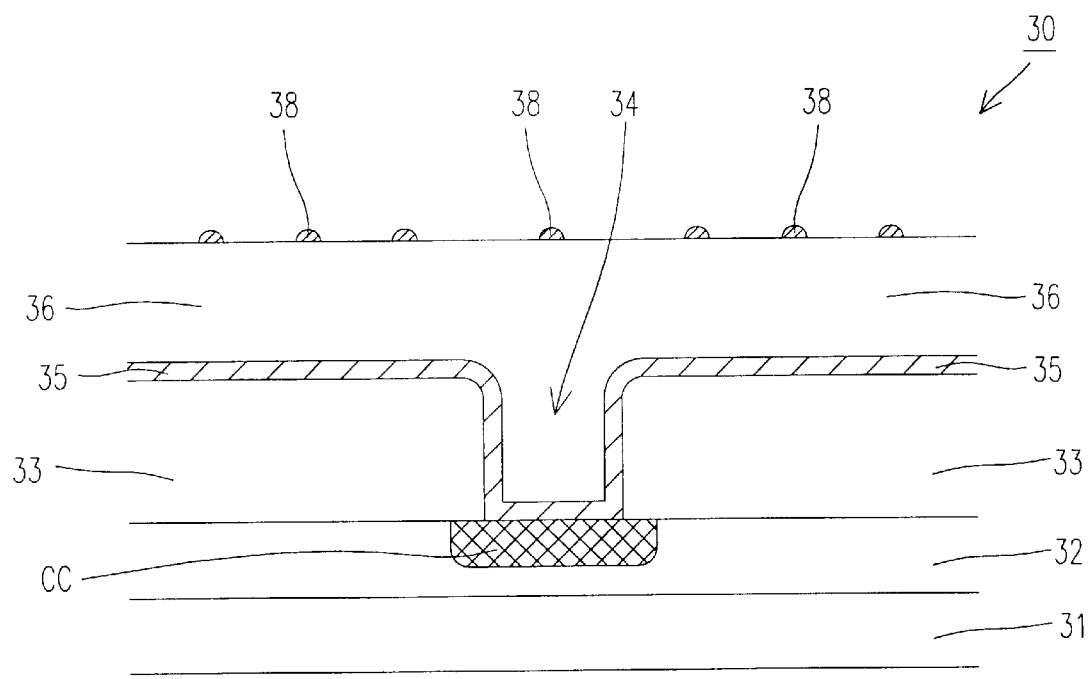

FIG. 3(d) shows a step to form an etching masking layer 38 over a portion of the etching sacrificial layer 36, wherein the etching masking layer 38 is a hemispherical grained Si (HSG) layer 38 formed at 560°~580° C.

Figure 3E:
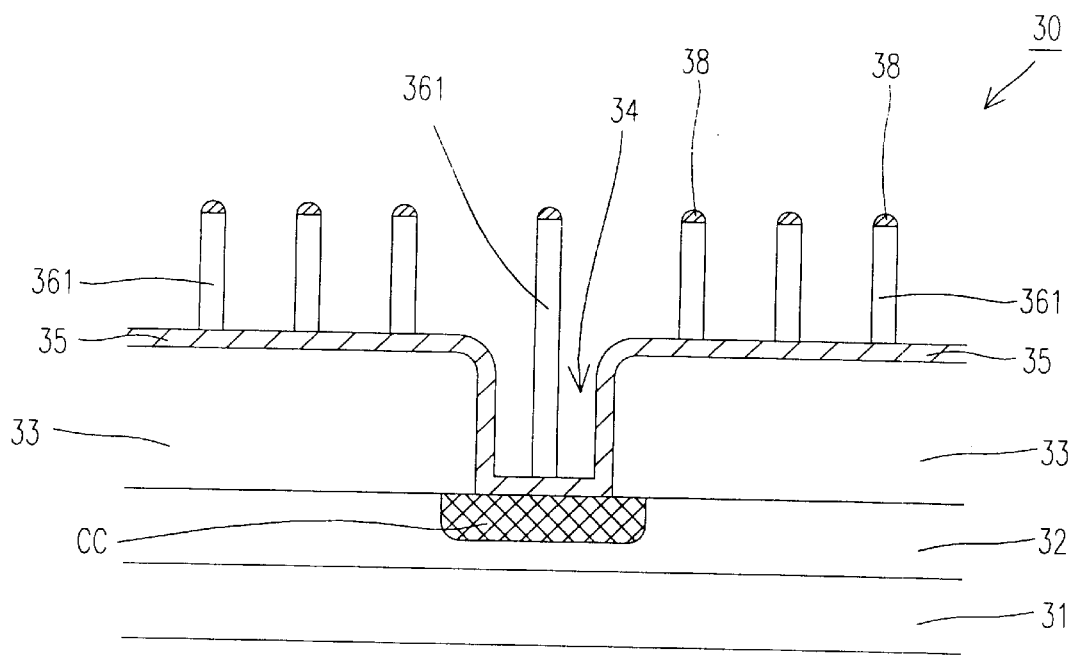

FIG. 3(e) shows a step to form a plural cylindrical etching sacrificial areas 361 by removing a portion of the etching sacrificial layer 36 while retaining the etching sacrificial layer 361 under the hemispherical grained Si (HSG) layer 38 through a dry etching process. A procedure time of the dry etching is detected in an endpoint detection mode (E/P) in order to completely remove the etching sacrificial layer not masked by the hemispherical grained Si (HSG) layer 38.

Figure 3F:
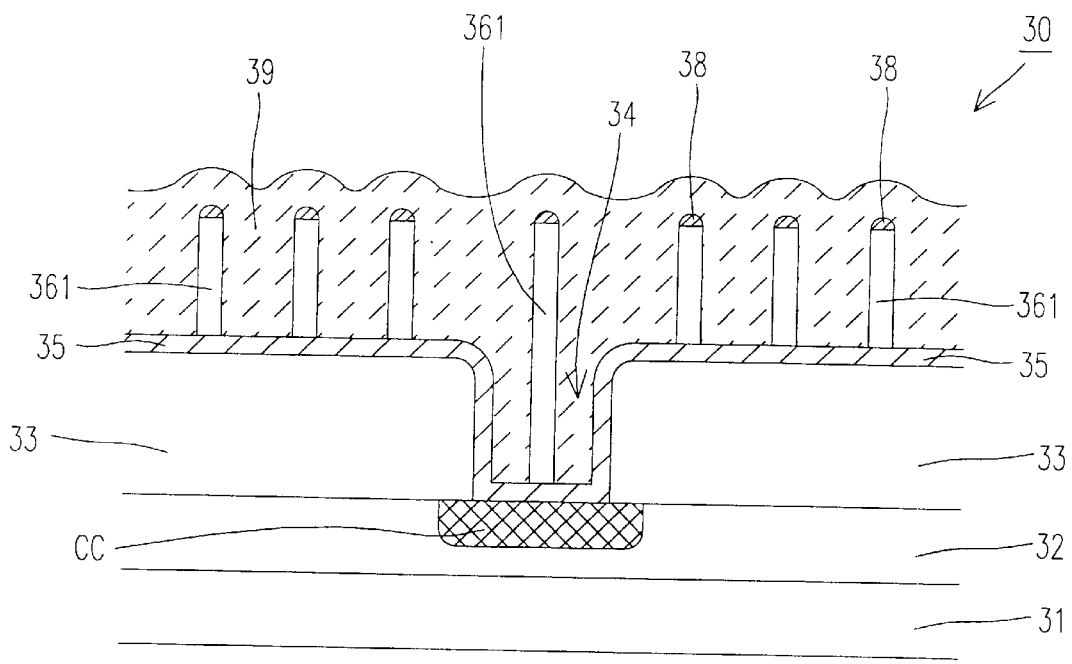

FIG. 3(f) shows a step to form a second conducting layer 39 on the top of the hemispherical grained Si (HSG) layer 38, on side walls of the plural cylindrical etching sacrificial areas 361, over the first conducting layer 35 and in the contact window 34 by a chemical vapor deposition, wherein the second conducting layer 39 can be a doped polysilicon layer and has a thickness of at least 700 Å or bigger than that of the gap between adjacent cylindrical etching sacrificial areas 361.

Figure 3G:
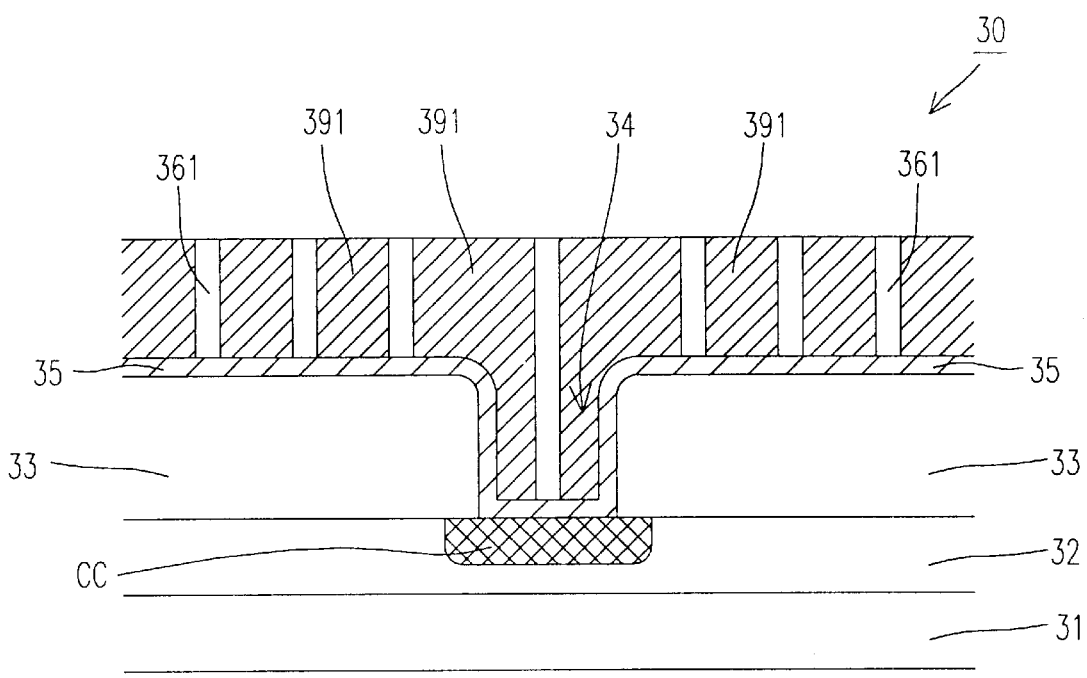

FIG. 3(g) shows a step to remove portions of the second conducting layer 39 and the hemispherical grained Si (HSG) layer 38 to expose tops of the plural cylindrical etching sacrificial areas 361 by an etch back process, wherein a procedure time of the etching back process is detected in a time mode (T/M) or in an endpoint detection mode (E/P).

Figure 3H:
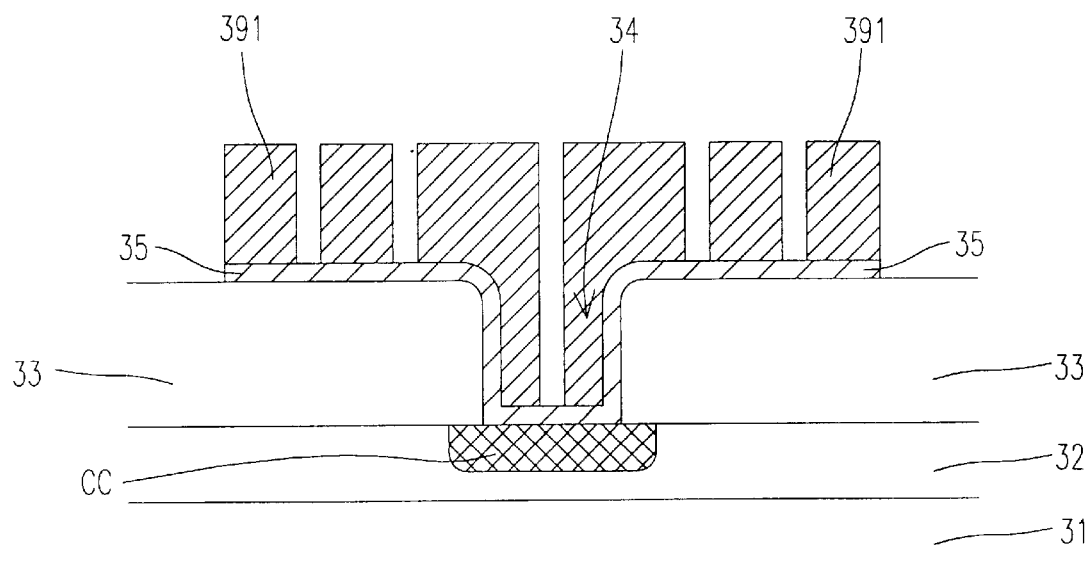

FIG. 3(h) shows steps to remove the plural cylinderical etching sacrificial areas 361 by dry etching or wet etching while retaining the first conducting layer 35 and the remained second conducting layer 391, and to remove portions of the first conducting layer 35 and the second conducting layer 391 for forming a first capacitor plate (a lower capacitor plate) by a photolithography and etching techique. The wet etching uses a buffer over etching (B.O.E.) solution containing hydrofluoric acid (HF). A procedure time of the dry etching is detected by endpoint detection mode (E/P) in order to completely remove the etching sacrificial layer not masked by the etching masking layer.

The present invention takes advantage of the geometric shape of the hemispherical polysilicon layer to form a plurality of cylindrical etching sacrificial areas 361 and then to form a second conducting layer 39 covering the cylindrical etching sacrificial areas 361. Thereafter, the cylindrical etching sacrificial areas 361 are removed by an etching process. Therefore, the second conducting layer 391 is a piece-like polysilicon layer with plural trenches which increase surface area and intensity of the capacitor more than those of the conventional capacitor. At the same time, the hemispherical grained Si (HSG) layer 38 is removed to avoid the defects of the conventional process.

Figure 3I:
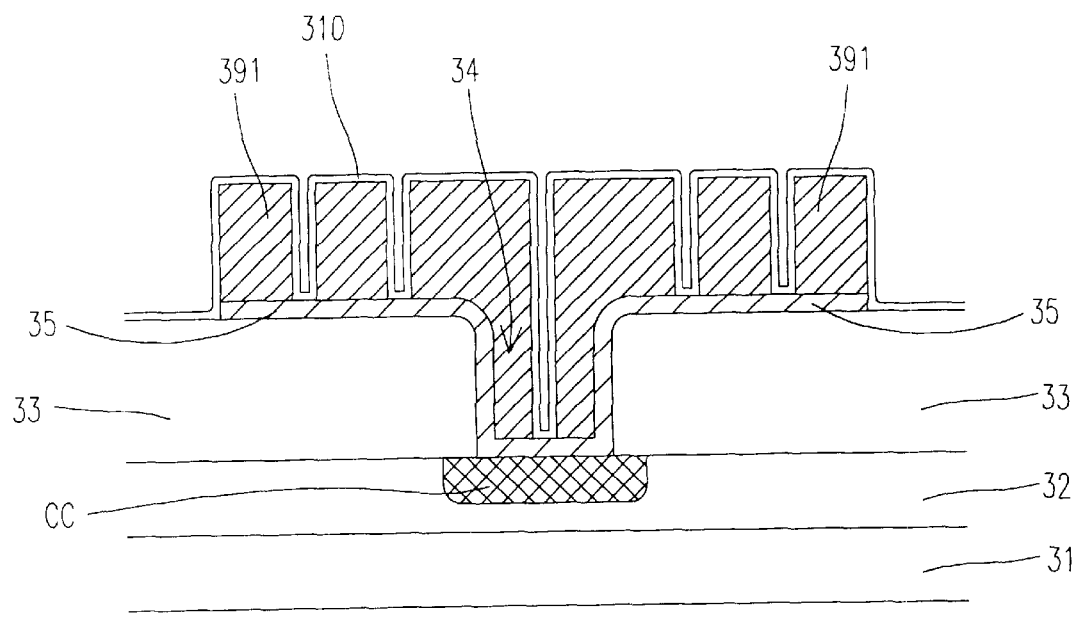

FIG. 3(i) shows a step to form a dielectric layer 310 over the first conducting layer 35 and on the top and side walls of the second conducting layer 391 by a chemical vapor deposition, wherein the dielectric layer 310 with a thickness ranged between 30 Å and 5000 Å is a layer of nitride, oxide-nitride (ON), nitride-oxide (NO), oxide-nitride-oxide (ONO), or oxide-nitride-oxide-nitride (ONON). The dielectric layer 310 can also be a layer of piezo-electric material (e.g. tantalum oxide ($Ta_2O_5$) or lead-zinc teleride (PZT)) or barium-strontium tantanite (BST).

Figure 3J:
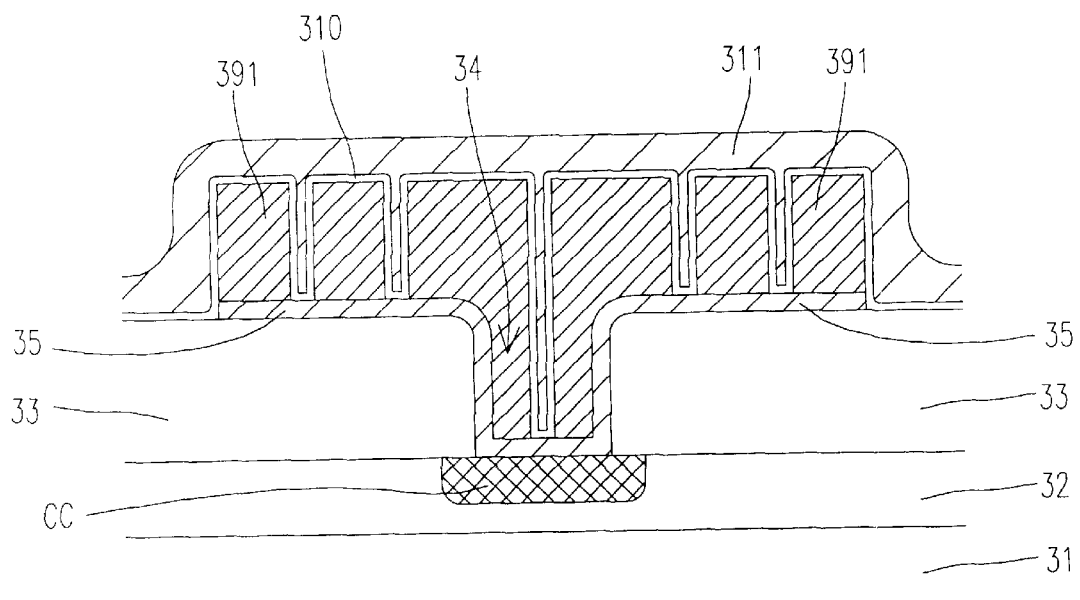

FIG. 3(j) shows a step to form a third conducting layer 311 over the dielectric layer 310 by a chemical vapor deposition, wherein the third conducting layer 311 can be a doped polysilicon layer served as a second capacitor plate (an upper capacitor plate).

Figure 4:
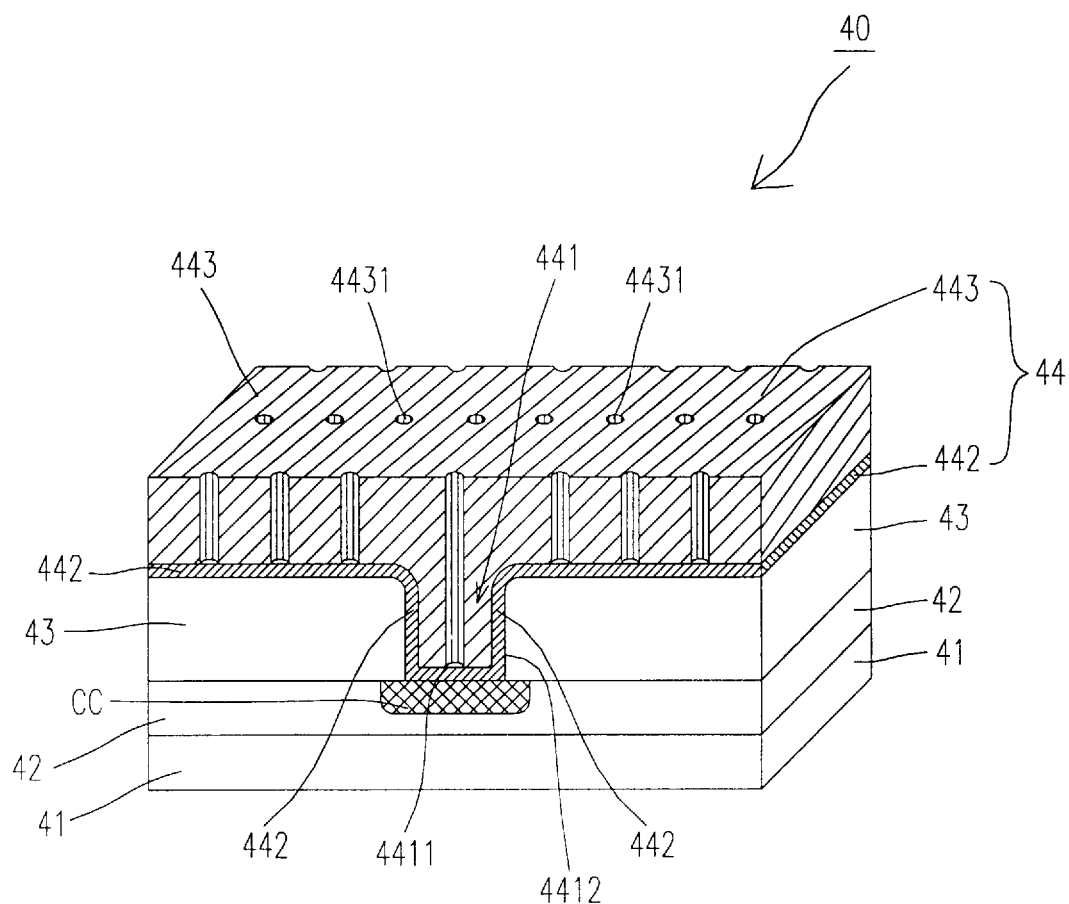
FIG. 4 is a perspective view showing a preferred embodiment of the stack capacitor of the present invention.

Please refer to FIG. 4 which is a perspective view of a preferred embodiment of the present invention. FIG. 4 shows a memory unit 40, preferably a dynamic random access memory (DRAM), including a substrate 41, a device 42, an insulator 43 and a stack capacitor 44. The stack capacitor 44 includes: (1) a contact window 441 distributed in the insulator 43 for exposing a cell contact CC of the device 42; (2) a first conducting layer 442 distributed over the insulator 43 and on the base 4411 and side walls 4412 of the contact window 441; (3) a second conducting layer 443 distributed over the first conducting layer 442 and having a plurality of trenches 4431 in order to increase the surface areas of the stack capacitor 44; (4) a dielectric layer (not shown but referring to FIG. 3(j)) distributed over the first and second conducting layer 442 and 443 and on side walls of a plurality of trenches 4431; and (5) a third conducting layer (not shown but referring to FIG. 3(j)) distributed over the dielectric layer. The first and second conducting layers are used to construct the first capacitor plate (or lower capacitor plate) and the third conducting layer is served as the second capacitor plate (or upper capacitor plate).

In conclusion, the present invention provides a stack capacitor with intensity of breakdown voltage increased and with parasitic capacity effect avoided so that it can be applied to the memory unit with high density. By taking advantage of a simple manufacturing process, the present invention also provides a stack capacitor with high capacity and high quality.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process of manufacturing a trenched stack-capacitor applied in a memory unit including a silicon substrate forming thereon a device forming thereon an insulator, which comprises steps of:
    a) forming a contact window in said insulator for exposing a cell contact of said device;
    b) forming a first conducting layer over said insulator and on side-walls and a base of said contact window;
    c) forming an etching sacrificial layer over said first conducting layer and inside said contact window;
    d) forming an etching masking layer over a portion of said etching sacrificial layer;
    e) forming a plural cylindrical etching sacrificial areas by removing portions of said etching sacrificial layer while retaining said etching sacrificial layer under said etching masking layer;
    f) forming a second conducting layer on a top surface of said etching masking layer, on side walls of said plural cylindrical etching sacrificial areas, over said first conducting layer and in said contact window;
    g) removing said plural cylindrical etching sacrificial areas while retaining said first conducting layer and said second conducting layer to form a first capacitor plate;
    h) forming a dielectric layer on a top surface of said first conducting layer and on a top and side walls of said second conducting layer; and
    i) forming a third conducting layer over said dielectric layer to serve as a second capacitor plate.

2. A process as claimed in claim 1, wherein said memory unit is a dynamic random access memory (DRAM).

3. A process as claimed in claim 1, wherein said device includes a transistor having a drain served as an area of said cell contact in said step (a).

4. A process as claimed in claim 3, wherein said transistor has a gate connected to a word line.

5. A process as claimed in claim 3, wherein said transistor has a source connected to a bit line.

6. A process as claimed in claim 5, wherein said trenched stack-capacitor is formed over said insulator by way of a capacitor over bit line (C.O.B.).

7. A process as claimed in claim 5, wherein said trenched stack-capacitor is formed under a second insulator, formed over said second capacitor plate, by way of a capacitor under bit line (C.U.B.).

8. A process as claimed in claim 1, wherein said insulator is one selected from a group consisting of a silicon dioxide ($SiO_2$) layer, a silicon nitride ($Si_3N_4$) layer, a silicon-oxy-nitride (SiOxNy) layer, a phosphosilicate glass (PSG) layer and a borophosphosilicate glass (BPSG) layer.

9. A process as claimed in claim 8, wherein said insulator is made of one of tetra-ethyl-ortho-silicate (TEOS) and silane ($SiH_4$).

10. A process as claimed in claim 8, wherein said insulator is formed by a chemical vapor deposition (CVD).

11. A process as claimed in claim 1, wherein said contact window of said step (a) is formed by a photolithography and etching techique.

12. A process as claimed in claim 1, wherein said first conducting layer of said step (b) is one layer of polysilicon or doped polysilicon.

13. A process as claimed in claim 1, wherein said first conducting layer of said step (b) is formed by a chemical vapor deposition (CVD).

14. A process as claimed in claim 1, wherein said etching sacrificial layer of said step (c) is a silicon dioxide ($SiO_2$) layer having a thickness ranged between 5000 Å and 10000 Å.

15. A process as claimed in claim 1, wherein said etching sacrificial layer of said step (c) is formed by a chemical vapor deposition (CVD).

16. A process as claimed in claim 1, wherein said etching masking layer of said step (d) is a hemispherical grained Si (HSG) layer.

17. A process as claimed in claim 1, further comprising after said step (d) a step of:
    (j) executing a photolithography and etching techique to remove portions of said etching masking layer, said etching sacrificial layer and said first conducting layer for defining said first capacitor plate.

18. A process as claimed in claim 1, wherein said step (e) said etching sacrificial layer is removed by a dry etching.

19. A process as claimed in claim 18, wherein a procedure time of said dry etching is detected by endpoint detection mode (E/P) in order to completely remove said etching sacrificial layer not masked by said etching masking layer.

20. A process as claimed in claim 1, wherein said step (f) a thickness of said second conducting layer is at least 700 Å which is more than a gap between adjacent cylindrical etching sacrificial areas formed after removing said portions of said etching sacrificial layer.

21. A process as claimed in claim 1, further comprising after said step (f) a step of:
    k) removing portions of said second conducting layer and said etching masking layer to expose tops of said plural cylindrical etching sacrificial areas.

22. A process as claimed in claim 21, wherein said step (k) said portions of said second conducting layer and said etching masking layer are removed by an etching back process.

23. A process as claimed in claim 22, wherein a procedure time of said etching back process is detected in a time mode (T/M).

24. A process as claimed in claim 22, wherein a procedure time of said etching back process is detected in an endpoint detection mode (E/P).

25. A process as claimed in claim 1, wherein said step (g) comprises:
- g1) executing a photolithography and etching techique to remove said plural cylinderical etching sacrificial areas while retaining said first conducting layer and said second conducting layer; and
- g2) removing portions of said first conducting layer and said second conducting layer for forming said first capacitor plate.

26. A process as claimed in claim 25, wherein said step (g1) said plural cylindrical etching sacrificial areas are removed by a dry etching.

27. A process as claimed in claim 25, wherein in said step (g1) said plural cylindrical etching sacrificial areas are removed by a wet etching.

28. A process as claimed in claim 27, wherein said wet etching uses buffer over etching (B.O.E.) solution containing hydrofluoric acid (HF).

29. A process as claimed in claim 1, wherein said step (h) said dielectric layer is one selected from a group consisting of layers of nitride, oxide-nitride (ON), nitride-oxide (NO), oxide-nitride-oxide (ONO), and oxide-nitride-oxide-nitride (ONON).

30. A process as claimed in claim 1, wherein said step (h) said dielectric layer is a piezo-electric layer.

31. A process as claimed in claim 30, wherein said piezo-electric layer is a layer of tantalum oxide ($Ta_2O_5$), lead-zinc teleride (PZT) or barium strontium tantanite (BST).

32. A process as claimed in claim 1, wherein said step (h) said dielectric layer has a thickness ranged between 30 Å and 5000 Å.

33. A process as claimed in claim 1, wherein said step (h) said dielectric layer is formed by a chemical vapor deposition (CVD).

* * * * *